(12) United States Patent
Chang et al.

(10) Patent No.: US 7,447,102 B2
(45) Date of Patent: Nov. 4, 2008

(54) MEMORY AND OPERATION METHOD THEREOF

(75) Inventors: Chuan-Jen Chang, Hsinchu County (TW); Wei-Li Liu, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 11/772,834

(22) Filed: Jul. 3, 2007

(65) Prior Publication Data

US 2008/0239861 A1    Oct. 2, 2008

(30) Foreign Application Priority Data

Mar. 30, 2007  (TW) .............. 96111250 A

(51) Int. Cl.
*G11C 8/00* (2006.01)
(52) U.S. Cl. ................ 365/230.03; 365/233.1
(58) Field of Classification Search ........... 365/230.03
See application file for complete search history.

(56) References Cited

U.S. PATENT DOCUMENTS

| | | | |
|---|---|---|---|
| 5,970,016 A * | 10/1999 | Ohsawa ............ | 365/230.03 |
| 6,249,476 B1 * | 6/2001 | Yamazaki et al. ...... | 365/230.03 |
| 6,351,427 B1 * | 2/2002 | Brown ............... | 365/230.03 |
| 6,603,683 B2 * | 8/2003 | Hsu et al. ............. | 365/189.04 |
| 7,203,810 B2 * | 4/2007 | Kim ................... | 711/168 |
| 7,254,075 B2 * | 8/2007 | Woo et al. ............ | 365/207 |
| 2006/0062072 A1 * | 3/2006 | Cho ................... | 365/230.03 |

* cited by examiner

*Primary Examiner*—Son L Mai
(74) *Attorney, Agent, or Firm*—Jianq Chyun IP Office

(57) ABSTRACT

A memory and an operation method thereof are provided. The present invention divides memory banks of the memory into a plurality of memory groups, wherein each memory group has an independent driving power for providing an operating voltage to the corresponding memory bank in the memory group. The present invention specifies two tRRD times which are an inter-group interval and an intra-group interval. The intra-group interval is the minimum time interval between selecting one row of memory banks in a memory group to selecting another row in the memory banks of the same memory group and the inter-group interval is the minimum time interval between selecting one row of the memory banks in one memory group to selecting another row in a different memory group. Further, the inter-group interval is shorter than or equal to the intra-group interval.

11 Claims, 6 Drawing Sheets

MEMORY AND OPERATION METHOD THEREOF

CROSS-REFERENCE TO RELATED APPLICATION

This application claims the priority benefit of Taiwan application serial no. 96111250, filed Mar. 30, 2007. All disclosure of the Taiwan application is incorporated herein by reference.

BACKGROUND OF THE INVENTION

1. Field of the Invention

The present invention relates to a memory, and more particularly, to a dynamic random access memory (DRAM) having different row to row delay times (tRRD time, hereinafter) and an operation method thereof.

2. Description of Related Art

A conventional semiconductor memory device usually includes a plurality of memory banks. Herein, each memory bank has the same storage space (i.e. having the same number of memory cells) and the same storage capacity. Particularly, the widely used dynamic random access memory (abbreviated as DRAM) is a standard memory structure that usually includes a plurality of memory banks having the same capacity. FIG. 1 is a schematic view illustrating a conventional DRAM structure. A memory 100 includes a memory unit 110 and a driving power 120. Herein, the memory unit 110 includes memory banks 101~108. When the system selects a row in the memory 100, the driving power 120 provides the voltage used for driving the corresponding circuit.

When the memory 100 receives an active signal, an address buffer receives an address inputted by the system and a row address is generated by a row address generator. According to the row address, the memory 100 reads data from the corresponding memory banks 101~108. Since the operating frequency of DRAM is very fast, the driving capacity of a single driving power 120 is unable to instantaneously provide the current required for operating the next row. Therefore, there is a delay between successive active signals outputted by the system to allow time for the driving power 120 to restore its driving capacity. This delay is known as the tRRD time in the specification for DRAM. Conventionally, the tRRD time is fixed regardless of whether the operation takes place in the same memory bank (any of the memory banks 101~108) or in different memory banks 101~108 such as switching from the memory bank 101 to the memory bank 102. As a result, when the tRRD time is greater than the tCCD time (CAS to CAS delay), the memory 100 is unable to read data consecutively, resulting in bubbles.

FIG. 2 is a schematic waveform diagram illustrating the clocks generated by a conventional art. Please refer to FIG. 1 for the following description. Active signals ACT1 and ACT2 respectively correspond to memory banks 101 and 102. Further, the time interval between receiving active signals ACT1 and ACT2 is tRRD time (i.e. 4 clock cycles in FIG. 2). Take the memory bank 101 as an example. The time interval between receiving the active signal ACT1 and a corresponding read command Read 1 is known as tRCD time (RAS to CAS delay; i.e. 7 clock cycles in FIG. 2). The time interval between receiving the read command Read 1 and outputting the data read to the bus is known as CL (i.e. 7 clock cycles). The same reading procedure applies for reading the memory bank 102. Hence, a detailed description thereof is omitted.

Since there are 4 clock cycles between the active signals ACT1 and ACT2, which is the length of a tRRD time, the time interval between outputting the read commands Read1 and Read2 is also 4 clock cycles. Similarly, regardless of whether the memory 110 reads data from the same memory bank (any of the memory banks 101~108) or from different memory banks 101~108, data bubbles are generated because the tRRD time is greater than the tCCD time, lowering the reading efficiency and wasting the system resources.

SUMMARY OF THE INVENTION

The present invention is directed to a memory that makes use of different tRRD times to shorten the time interval for selecting rows in different memory groups in order to improve data selection efficiency.

The present invention is also directed to a memory that divides memory banks of the memory into different memory groups where each memory group has an independent driving power to decrease the tRRD time between memory groups in order to improve the speed for selecting data.

In addition, the present invention is directed to a method for operating a memory that makes use of different tRRD times to allow the memory to read data through utilizing the shorter tRRD times when selecting rows in different memory groups in order to minimize the generation of bubbles.

Further, the present invention is directed to a memory that includes a first memory group and a second memory group. The first memory group includes a plurality of first memory banks and the second memory group includes a plurality of second memory banks. The memory selects the minimum time interval between selecting rows in the first memory group and the second memory group as an inter-group interval. On the other hand, the minimum time interval for the memory to select a row in the first memory group to selecting another row in the first memory group or to select a row in the second memory group to selecting another row in the second memory group is an intra-group interval, Herein, the inter-group interval is smaller than the intra-group interval.

In another embodiment of the present invention, the said memory selects a row in the first memory bank of the first memory group according to the first active signal and selects a row in the second memory bank of the second memory group according to the second active signal. Herein, the minimum time interval between the first active signal and the second active signal equals to the inter-group interval. Further, if the memory selects a row in the first memory group, the memory can select another row in the second memory group after the inter-group interval.

According to another embodiment of the present invention, the memory further includes a first driving power and the second driving power. Herein, the first driving power provides a first operating voltage to the first memory group, and the second driving power provides a second operating voltage to the second memory group.

According to another embodiment, the present invention is directed to a method for operating a memory that includes the following steps. First, a row in a first memory group is selected based on a first active signal and a row in a second memory group is selected based on a second active signal. Herein, the minimum time interval between outputting the second active signal and the first active signal is an inter-group interval. Next, another row in the first memory group is selected based on a third active signal. Herein, the minimum time interval between outputting the third active signal and the first active signal is an intra-group interval. Further, the inter-group interval is smaller than the intra-group interval.

In one embodiment of the present invention, the said first memory group includes a plurality of first memory banks and the said second memory group includes a plurality of second memory banks. Moreover, the method for operating a memory according to the present invention further includes the following steps. First, a first driving power is installed to provide a first operating voltage to a first memory group. In addition, a second driving power is installed to provide a second operating voltage to the second memory group.

In view of the above, the present invention makes use of different tRRD times to improve the data reading speed for the memory and minimize the generation of bubbles. Further, the present invention divides the memory banks into different memory groups and respectively installs different driving powers to improve the response speed of the memory and reduce the length of tRRD time. Utilizing the memory structure and the selection method of the present invention improves the data reading speed of the memory and minimize the generation of bubbles to prevent wasting the system resources.

In order to make the aforementioned and other objects, features and advantages of the present invention more comprehensible, preferred embodiments accompanied with figures are described in detail below.

DESCRIPTION OF EMBODIMENTS

Figure 3:
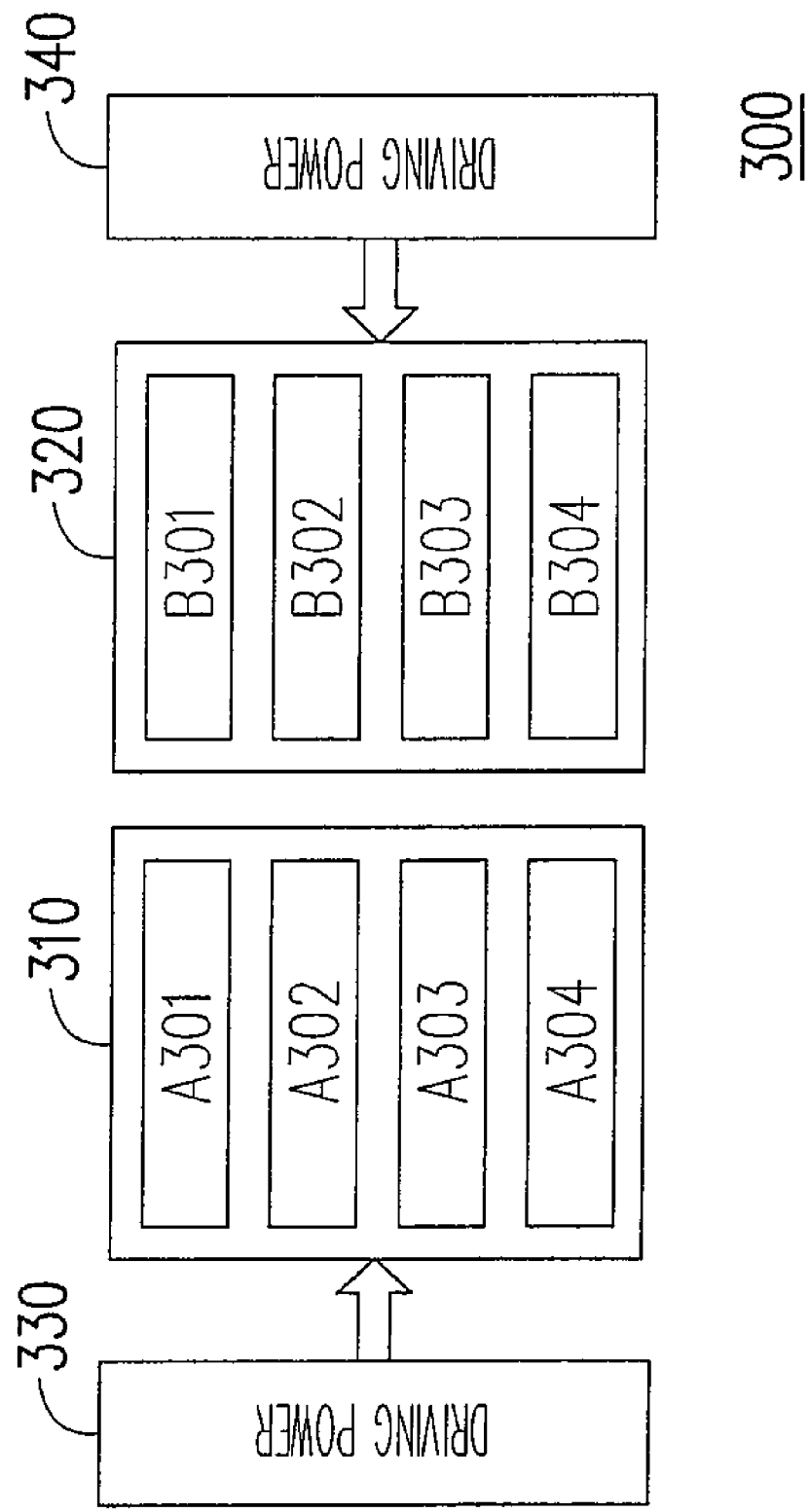
FIG. 3 is a schematic diagram illustrating a memory structure according to one embodiment of the present invention.

FIG. 3 is a schematic diagram illustrating a memory structure according to one embodiment of the present invention. A memory 300 includes driving powers 330 and 340, and memory groups 310 and 320. Herein, the driving power 330 is coupled to the memory group 310 and the driving power 340 is coupled to the memory group 320. The memory group 310 includes memory banks A301~A304. The memory group 320 includes memory banks B301~B304. In other words, the memory 300 divides memory banks into A301~A304 and B301~B304. Further, different driving powers 330 and 340 are respectively installed to instantaneously provide the operating voltage required by the memory 300. The driving powers 330 and 340 are independent voltage sources. However, the power lines can be connected or arranged individually. When the memory 300 needs to read the data in the memory banks A301~A304, the driving power 330 provides the operating voltage to the corresponding memory cells in the memory banks A301~A304 to perform operations such as activation, and reading/writing.

The location of each memory cell in the memory 300 can be divided by a plurality of row addresses and a plurality of column addresses. Data in different memory cells can be read by selecting different row addresses and different column addresses. In the present embodiment, the minimum time interval for the memory 300 to select a row in the memory group 310 to selecting a row in the memory group 320 is known as inter-group interval (tRRD-inter). Further, the minimum time interval for the memory 300 to select a row in one memory group to selecting another row in the same memory group (e.g. the memory group 310 or the memory group 320) is known as intra-group interval (tRRD-intra). Herein, the tRRD-inter is smaller than the tRRD-intra. In other words, there are two types of intervals for outputting the active signals and they respectively are tRRD-inter and tRRD-intra. The tRRD-intra refers to the minimum time interval for repeatedly opening (or selecting) rows in the same memory group. On the other hand, the tRRD-inter refers to opening (or selecting) rows in different memory groups.

For example, when the memory 300 selects a row in the memory banks A30118 A304 of the memory group 310 according to the first active signal and selects a row in the memory banks B301~B304 of the memory group 320 according to the second active signal, the minimum time interval between receiving the first active signal and the second active signal equals to the tRRD-inter. In addition, when the memory 300 selects a row in the memory banks A301~A304 of the memory group 310 according to the third active signal, the minimum time interval between receiving the third active signal and the first active signal equals to the tRRD-intra.

Since the memory 300 performs data reading according to the active signal received, each active signal thus corresponds to a row in the memory group 310 or that in the memory group 320. For preventing the generation of a gap (data bubble) when outputting data, the memory 300 reads data from the memory groups alternately. First, the memory 300 reads data from the memory banks A301~A304 of the memory group 310. Next, the memory switches to reading the next data from the memory banks B301~B304 of the memory group 320. Since the tRRD-inter is smaller than the tRRD-intra, reading data through switching between different memory groups 310 and 320 is comparatively faster than consecutively reading two sets of data through accessing the same memory group 310 or 320.

In other words, in the present embodiment, if the memory 300 reads the data from the memory group 310 first, the next set of data is read from the memory group other than the memory group 310 (i.e. the memory group 320). In terms of active signals, if the first active signal corresponds to the memory banks A301~A304 of the memory group 310, then the next active signal corresponds to the memory group other than the memory group 310 (i.e. the memory group 320).

In a conventional memory structure, there is no such concept as dividing the memory banks of the memory into different memory groups. Further, the memory is limited by the driving capacity and speed of the driving power. Thus, the tRRD time is always fixed. As a result, it is easy to generate bubbles when reading data, wasting the computational resources of the system. In the present embodiment, the memory 300 includes two driving powers 330 and 340 which are respectively responsible for providing voltage to the memory groups 310 and 320. Since the driving powers 330 and 340 are independent, the previous power drive does not affect the next power drive. Hence, the tRRD-inter can be smaller than the tRRD-intra. Compared to a conventional system structure powered by a single driving power, the independent driving powers 330 and 340 can provide operating voltage at a faster speed.

Figure 4:
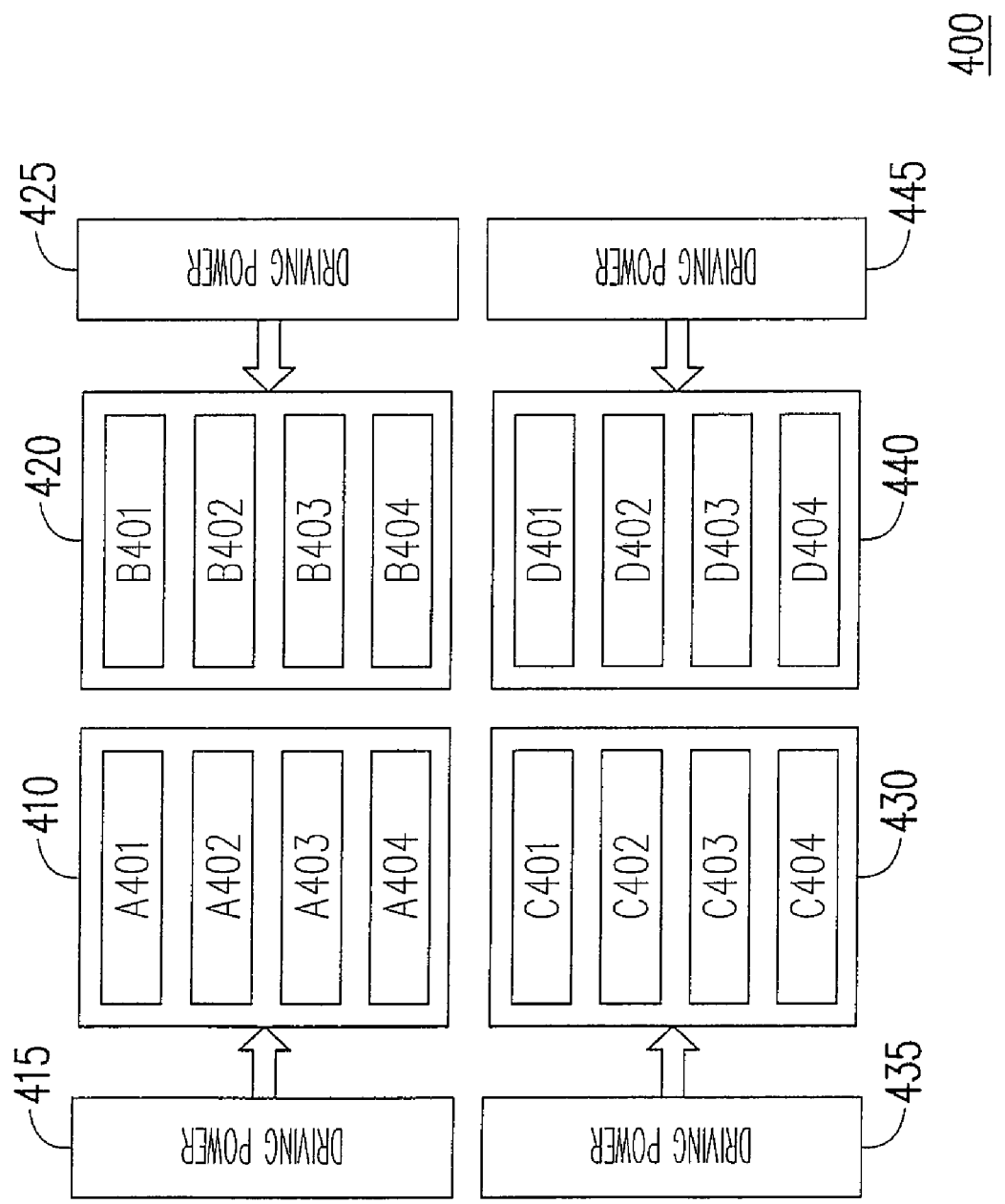
FIG. 4 is a schematic diagram illustrating a memory structure according to another embodiment of the present invention.

In another embodiment of the present invention, the present invention can divide the memory banks of the memory into a plurality of memory groups as shown in FIG. 4. FIG. 4 is a schematic diagram illustrating the memory structure according to another embodiment of the present invention. A memory 400 includes memory groups 410~440 and driving powers 415, 425, 435, and 445. Herein, the memory group 410 includes memory banks A401~A404, the memory group 420 includes memory banks B401~B404, the memory group 430 includes memory banks C401~C404, and the memory group 440 includes memory banks D401~D404. The minimum time interval for the memory 400 to select a row from one of the memory groups 410~440 to selecting a row in another group is known as tRRD-inter. On the other hand, the minimum time interval for the memory 400 to select a row from any of the memory groups 410~440 to another row in the same memory group is known as tRRD-intra. Please refer to FIG. 5. When the memory 400 selects the memory banks A401~A404 of the memory group 410 according to the active signal ACT1, the memory 400 can select any of the memory groups 420, 430 and 440 according to the next active signal. Next, the memory 400 can return to the memory group 410 to select another row. In other words, the memory 400 can switch among the memory groups 410~440 to increase the speed for reading out data and selecting operation of the memory banks to prevent the generation of bubbles. Please refer to the description of FIG. 3 for the remaining operation procedure of the embodiment of FIG. 4. Hence, a detailed description thereof is omitted.

Figure 5:
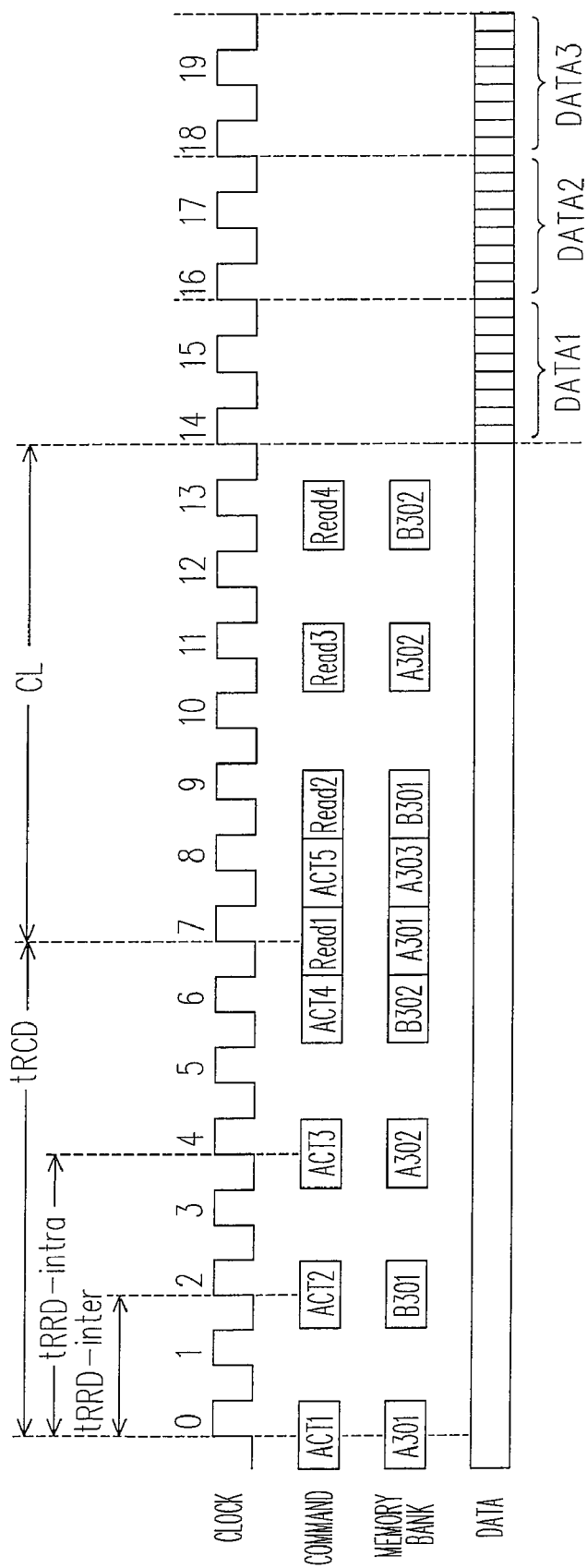
FIG. 5 is a waveform diagram illustrating the clocks generated according to another embodiment of the present invention.

FIG. 5 is a waveform diagram illustrating the clocks generated according to another embodiment of the present invention. Please refer to FIG. 3 for the following description. An active signal ACT1 (located at the $0^{th}$ clock) corresponds to the memory bank A301 of the memory group 310. An active signal ACT2 (located at the $2^{nd}$ clock) corresponds to the memory bank B301 of the memory group 320. Herein, the time interval between receiving the active signal ACT1 and the active signal ACT2 is an inter-group interval (tRRD-inter). It should be noted that the tRRD-inter equals to two clock cycles in the present embodiment. An active signal ACT3 (located at the $4^{th}$ clock) corresponds to the memory bank A302 of the memory group 310. Herein, the time interval between receiving the active signal ACT3 and the active signal ACT1 is an intra-group interval (tRRD-intra). It should be noted that the tRRD-intra equals to four clock cycles in the present embodiment. In other words, the minimum time interval for the memory 310 to select a row in a memory group to selecting the next row in the same memory group is greater than 4 clock cycles. This is because the memory banks A301 and A302 both belong to the same memory group 310.

After the memory 300 receives the active signal ACT1, ACT2 or ACT3 and the time interval, the memory 300 can receive a read command or a write command to read or write data to the corresponding memory bank after a RAS to CAS delay time (tRCD time), which equals to seven clock cycles in the present embodiment. Hence, when the $7^{th}$ clock is activated, the memory 300 can receive the read command Read1 to read data from the memory bank A301 according to the active signal ACT1. Further, when the $9^{th}$ clock is activated, the memory 300 can receive another read command Read2 to read data from the memory bank B301 according to the active signal ACT2. Additionally, when the $11^{th}$ clock is activated, the memory 300 can receive a read command Read3 to read data from the memory bank A302 according to the active signal ACT3. Between the read interval form a read command to another read command, the memory 300 can handle the remaining active signals such as ACT4 and ACT5 to make data reading more efficient. Utilizing the method for activation/selection and reading of the present invention ensures data is outputted more frequently to prevent wasting clocks.

In the present embodiment, the tRRD-inter is equal to two clock cycles. Hence, the minimum time interval between successive active signals can be set to two clock cycles. In other words, the time interval between successive readings performed by the memory 300 is two clock cycles at maximum. Certainly, in another embodiment of the present invention, the tRRD-inter is not limited to the aforementioned two clock cycles. Specifically, the time interval can be set to one single clock cycle with appropriate driving power installed. Further, the operation methods for reading/writing the memory are similar. Hence, the present invention can also be used for writing data.

Figure 1:
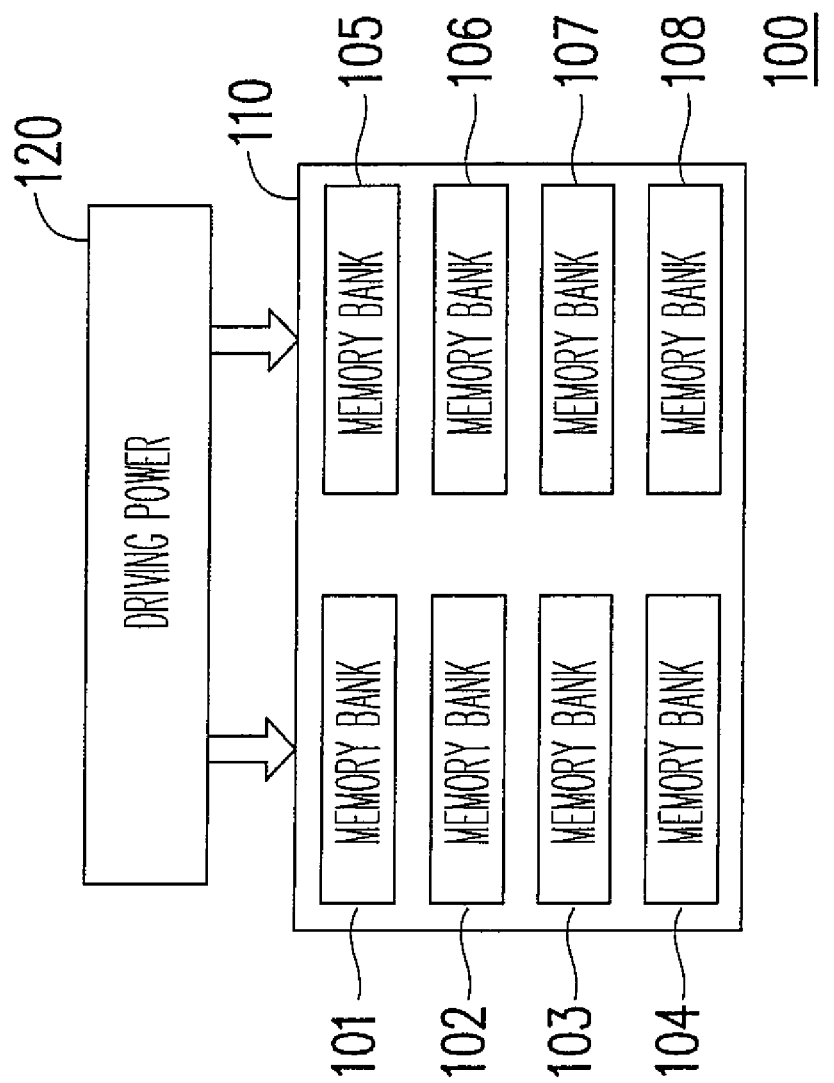
FIG. 1 is a schematic diagram illustrating a conventional DRAM structure.
Figure 2:
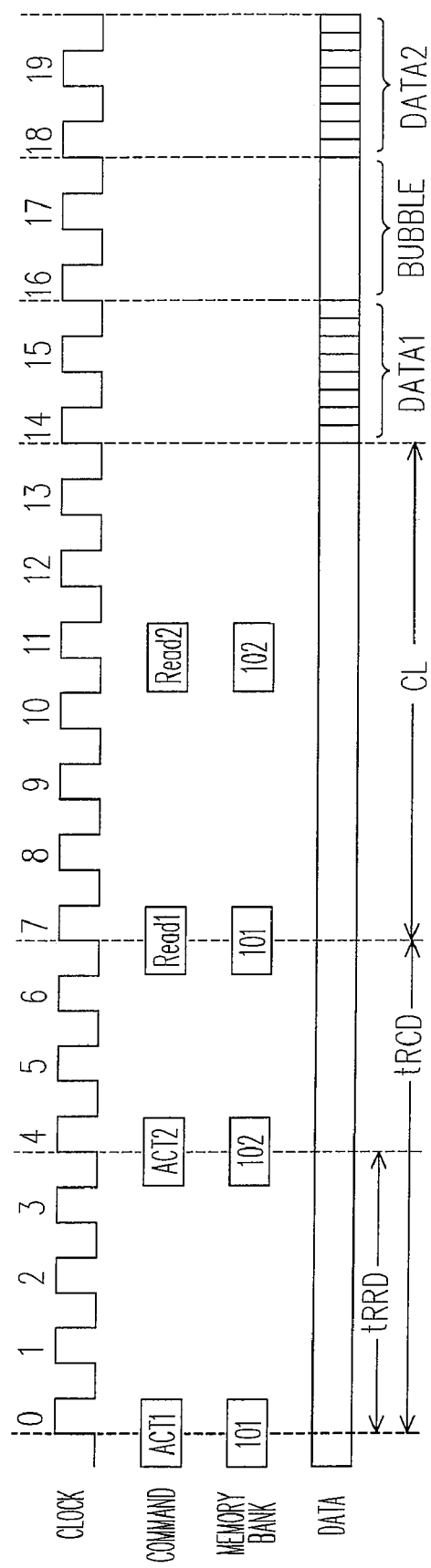
FIG. 2 is a schematic waveform diagram illustrating the clocks generated by a conventional art.

After the memory 310 has received a read command that corresponds to a memory bank such as A301 and the time interval CL has passed (i.e. seven clock cycles in the present embodiment), the read data is outputted to the bus. As shown by the data row in FIG. 5, data DATA1~DATA3 are outputted sequentially. As a result, no bubble is generated. Comparing FIG. 5 to the conventional art shown in FIG. 2, it is obvious that the present invention has higher data output efficiency. Moreover, the present invention can be used in DRAM with specification such as DDR(double-data-rate)1~DDR4. Therefore, the aforementioned specification of time such as tRCD, tRRD and CL are not limited by the scope of the above-mentioned embodiments. Applications can be easily deduced by those of ordinary skills in the art according to the disclosure of the present invention, and will not be described herein again.

Figure 6:
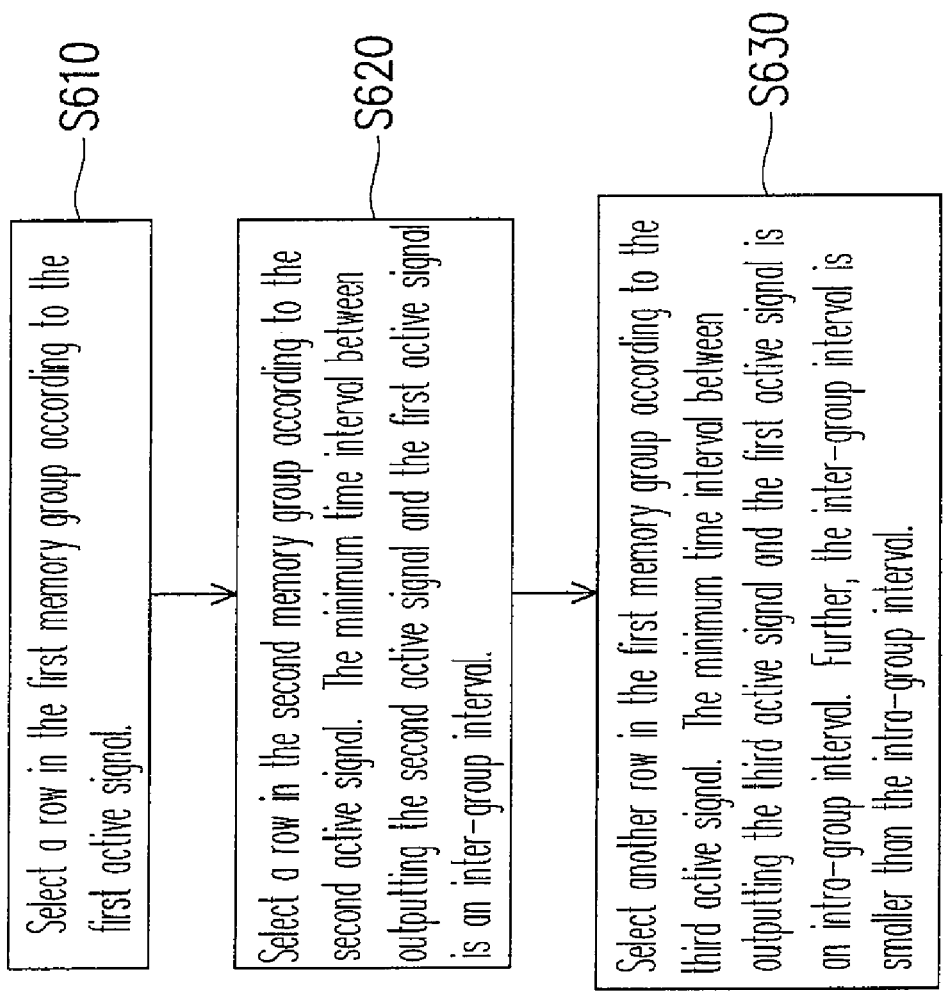
FIG. 6 is a flow chart illustrating a method for operating a memory according to another embodiment of the present invention.

FIG. 6 is a flow chart illustrating a method for operating a memory according to another embodiment of the present invention. Please refer to FIG. 3 for the following description. First, step S610 selects a row in a first memory group such as the memory group 310 according to a first active signal. Next, step S620 selects a row in a second memory group such as the memory group 320 according to a second active signal. Herein, the minimum time interval between outputting the second active signal and the first active signal is an inter-group interval. Next, step S630 selects another row in the first memory group according to a third active signal. Herein, the minimum time interval between outputting the third active signal and the first active signal is an intra-group interval. Herein, the inter-group interval is smaller than the intra-group interval.

Further, the order of receiving the active signals is as follows: the first active signal, the second active signal and the third active signal. Moreover, in another embodiment of the present invention, the method for operating a memory further includes the following steps. First, a first driving power is installed to provide an operating voltage to a first memory group. In addition, a second driving power is installed to provide an operating voltage to the second memory group. Please refer to the description for the above FIG. 3~FIG. 5 for the remaining operation procedure for operating the said memory. Hence, a detailed description thereof is omitted.

The present invention divides memory banks of the memory into different memory groups adapted for different tRRD times in order to increase the speed of the memory in selecting rows among different memory groups and reading data, reducing the generation of bubbles.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory, comprising:
    a first memory group including a plurality of first memory banks; and
    a second memory group including a plurality of second memory banks;
    wherein the minimum time interval for the memory to select a row in the first memory group to selecting a row in the second memory group is an inter-group interval, the minimum time interval for the memory to select a row in the first memory group to selecting another row in the first memory group is an intra-group interval, and the inter-group interval is smaller than the intra-group interval.

2. The memory of claim 1, wherein the minimum time interval for the memory to select a row in the second memory group to selecting another row in the second memory group is an intra-group interval.

3. The memory of claim 1, wherein the memory selects a row in the first memory banks of the first memory group according to a first active signal, the memory selects a row in the second memory banks of the second memory group according to a second active signal, and the minimum time interval between the first active signal and the second active signal equals to the inter-group interval.

4. The memory of claim 1, wherein when the memory selects a row in the first memory group, the memory selects a row in the second memory group after the inter-group interval.

5. The memory of claim 1, wherein the memory sequentially selects rows in the first memory banks of the first memory group according a third active signal and a fourth active signal, and the minimum time interval between the third active signal and the fourth active signal equals to the intra-group interval.

6. The memory of claim 1, wherein the memory further comprises:
    a first driving power providing a first operating voltage to the first memory group; and
    a second driving power providing a second operating voltage to the second memory group.

7. The memory of claim 1, wherein the memory further comprises:
    a third memory group including a plurality of third memory banks and a third driving power.

8. A method for operating a memory, comprising:
    selecting a row in a first memory group according to a first active signal; and
    selecting a row in a second memory group according to a second active signal, wherein the minimum time interval between outputting the second active signal and the first active signal is an inter-group interval; and
    selecting another row in a first memory group according to a third active signal, wherein the minimum time interval between outputting the third active signal and the first active signal is an intra-group interval, and the inter-group interval is smaller than the intra-group interval.

9. The method of claim 8, wherein the first memory group comprises a plurality of first memory banks, and the second memory group comprises a plurality of second memory banks.

10. The method of claim 9, wherein the method further comprises:
    installing a first driving power to provide a first operating voltage to the first memory group; and
    installing a second driving power to provide a second operating voltage to the second memory group.

11. The method of claim 9, wherein the method further comprises sequentially receiving the first active signal, the second active signal and the third active signal.

* * * * *